US007153783B2

United States Patent
Lu et al.

(10) Patent No.: US 7,153,783 B2
(45) Date of Patent: Dec. 26, 2006

(54) MATERIALS WITH ENHANCED PROPERTIES FOR SHALLOW TRENCH ISOLATION/PREMETAL DIELECTRIC APPLICATIONS

(75) Inventors: Victor Lu, Santa Cruz, CA (US); Lei Jin, San Jose, CA (US); Arlene J. Suedmeyer, San Jose, CA (US); Denis H. Endisch, Cupertino, CA (US); Paul G. Apen, San Francisco, CA (US); Brian J. Daniels, La Honda, CA (US); Deling Zhou, Sunnyvale, CA (US); Ananth Naman, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 155 days.

(21) Appl. No.: 10/886,247

(22) Filed: Jul. 7, 2004

(65) Prior Publication Data

US 2006/0008659 A1    Jan. 12, 2006

(51) Int. Cl.
*H01L 21/31*    (2006.01)

(52) U.S. Cl. .................. 438/758; 438/778; 438/781; 438/787

(58) Field of Classification Search ............. 438/424, 438/778, 780, 781, 787, 789, 790, 758
See application file for complete search history.

(56) References Cited

U.S. PATENT DOCUMENTS

| | | | |
|---|---|---|---|
| 6,268,457 B1 | 7/2001 | Kennedy et al. | 528/39 |
| 6,365,765 B1 | 4/2002 | Baldwin et al. | 556/440 |
| 6,368,400 B1 | 4/2002 | Baldwin et al. | 106/481 |
| 6,605,362 B1 | 8/2003 | Baldwin et al. | 428/447 |

FOREIGN PATENT DOCUMENTS

WO    WO 03088344    * 10/2003

* cited by examiner

*Primary Examiner*—Kevin M. Picardat
(74) *Attorney, Agent, or Firm*—Roberts & Roberts, LLP

(57) ABSTRACT

The present invention relates to semiconductor device fabrication and more specifically to a method and material for forming high density shallow trench isolation structures in integrated circuits capable of withstanding wet etch treatments. A silica dielectric film is formed on a substrate. The silica dielectric film has a density of from about 1.0 to about 2.3 g/ml, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less.

35 Claims, No Drawings

MATERIALS WITH ENHANCED PROPERTIES FOR SHALLOW TRENCH ISOLATION/PREMETAL DIELECTRIC APPLICATIONS

BACKGROUND OF THE INVENTION

1. Field of the Invention

The present invention relates to semiconductor device fabrication and more specifically to a method and material for forming high density shallow trench isolation structures in integrated circuits, which are capable of withstanding wet etch treatments.

2. Description of the Related Art

In the semiconductor industry, there is a continuing trend toward higher device densities. In order to achieve integrated circuits (ICs) with increased performance, the characteristic dimensions of devices and spacings on the ICs continue to be decreased. To achieve these high densities there have been continuing efforts toward scaling down device dimensions at submicron levels on semiconductor wafers. In order to accomplish such high device packing density, smaller and smaller feature sizes are required. This may include the width and spacing of interconnecting lines, spacing and diameter of contact holes, and the surface geometry such as corners and edges of various features. It is also advantageous to reduce the scale of the isolation regions that are formed between the devices. Although the fabrication of smaller devices and isolation regions allows more devices to be placed on a single monolithic substrate for the formation of relatively large circuit systems in a relatively small die area, this downscaling can result in a number of performance degrading effects.

Fabrication of such devices often requires the deposition of dielectric materials into features patterned on substrates (such as Si, Ge, and other group III–V semiconductor substrates). In order to achieve proper isolation between devices in integrated circuits, a technique known as Shallow Trench Isolation (STI) is used. As the elements incorporated into a semiconductor device are integrated to a high degree, there is a growing tendency to increasingly use the STI method as a method of forming an isolation layer. STI involves forming trenches in a layer of silicon and then filling the trenches with silicon oxide. The trenches can be lined with a silicon oxide liner formed by a thermal oxidation process and then filled with additional silicon oxide or another material, such as polysilicon. These filled trenches define the size and placement of the active regions. The use of STI significantly shrinks the area needed to isolate transistors. Each isolated region is separated by the trenches and the insulating layer filled therein. In deep sub-micron integration, STI with higher aspect ratios (height/width) are required, which may have a width as small as 10 to 90 nm or even smaller in next generation devices. Aspect ratios may range from 10 to 60. Accordingly, there exists a need in the art for improved isolation between semiconductor devices and for techniques of fabricating improved isolation regions along with semiconductor devices. Clearly, there is a need to develop a material that can fill such narrow features without cracking and voids. Furthermore, the desired dielectric materials need to be able to withstand processing steps, such as high temperature anneal, chemical mechanical polishing (CMP), RIE etch, HF wet etch and cleaning steps.

In most cases, it is critical to have STI features completely filled with the dielectric materials without cracking and voids. Typically, dielectric materials are deposited by chemical vapor deposition (CVD) or by spin-on processes. The existing CVD (SACVD, LPCVD, HDP CVD and et. al.) and atomic layer deposition (ALD) approaches often lead to voiding inside of the trenches; and/or elaborative deposition/etch steps that are not feasible for gap-filling narrow features. In most cases it is important that the dielectric material completely fill such features, which may be as small as 0.01 to 0.05 µm or even smaller in next generation devices. Filling such narrow features, i.e. gap filling, places stringent requirements on materials used.

Several undesirable effects may arise from devices employing high aspect ratio STI. These include damage to the substrate due to excessive etching and severe microloading effects between dense and open trenches. Additionally, problems may result from incomplete clearing of etch by-product residue at the bottom of narrow trenches. Relatively narrow STI regions (e.g., about 180 Å or less) formed using conventional techniques have a tendency lose their ability to isolate adjacent devices. The premetal dielectric (PMD) layer on an integrated circuit isolates structures electrically from metal interconnect layers and isolates them electrically from contaminant mobile ions that degrade electrical performance. PMD layers may require filling narrow gaps having aspect ratios, that is the ratio of depth to width, of five or greater. Accordingly, there exists a need in the art for improved isolation between semiconductor devices and for techniques of fabricating improved isolation regions along with semiconductor devices.

Spin-on glasses and spin-on polymers such as silicate, silazane, silisequioxane or siloxane generally exhibit good gap-fill properties. The silicon oxide films are formed by applying a silicon-containing pre-polymer onto a substrate followed by a bake and a high temperature anneal. Historically, the spin-on approach has been hampered by the unacceptable film cracking inside narrow trenches as the result of high film shrinkage after high temperature anneal which exceed 750° C. Film cracking can also lead to undesirable high HF wet etch rate and un-reliable yield issues. Thus, there exists a need in the art for dielectric spin-on materials that provides crack-free and void-free gap-fill of narrow features at high process temperatures. These materials need to have a very desirable degree of wet etch resistance and hardness which is comparable to PECVD oxide. The PMD materials also need to be able to withstand processing steps, such as etch, cleaning and chemical mechanical polishing steps. Thus there is a need for a PMD material that provides void-free gap-fill of narrow features and reasonable resistance to etching (both wet and dry etch) to survive subsequent processing steps. Such materials should also have adequate mechanical strength to withstand blank chemical mechanical polishing. The invention provides gap fill materials with such enhanced wet etch resistance. As density of a given material increases, its wet etch removal rate decreases. High density can be achieved by using a condensation/cross-linking catalyst including ammonium compounds, amines, phosphonium compounds and phosphine compounds. Through the use of a catalyst one can effectively lower the condensation temperature and/or drive the extent of cross-linking of silanol groups. Alternatively, one may enhance hydrophobicity of the materials so that its wetting property in an aqueous etching solution is diminished and hence, a greater resistance to aqueous wet etching solutions can be achieved. For example by increasing the organic content in the film through design of the materials. A balance between the amount of organic content, density of the film and mechanical strength has to be maintained. The material must withstand wet etch chemistries, i.e., diluted and buffered aqueous HF solutions.

SUMMARY OF THE INVENTION

The invention provides a method of producing a silica dielectric film comprising (a) preparing a composition comprising a silicon containing pre-polymer, a metal-ion-free catalyst, and optionally water;

(b) coating a substrate with the composition to form a film, (c) crosslinking the composition with at least one of i), ii) and iii):
  i) heating the composition at a temperature of from about 350° C. to about 650° C.,
  ii) exposing the composition to sufficient ultraviolet radiation,
  iii) exposing the composition to sufficient electron beam radiation, effective to produce a substantially crack-free, and substantially void-free silica dielectric film having a density of from about 1.0 to about 2.3 g/ml, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less.

The invention also provides a method of forming isolation structures in a semiconductor substrate comprising:

a) etching trenches in a semiconductor substrate, thereby forming substantially unetched areas of said substrate between said trenches;

b) depositing a composition that substantially fills said trenches and forms a film, said composition comprising a silicon containing pre-polymer, a metal-ion-free, optionally water, and optionally phosphorous and/or boron doping;

(c) crosslinking the composition with at least one of i), ii) and iii):
  i) heating the composition at a temperature of from about 350° C. to about 650° C.,
  ii) exposing the composition to sufficient ultraviolet radiation,
  iii) exposing the composition to sufficient electron beam radiation, effective to produce a substantially crack-free, and substantially void-free silica dielectric film having a density of from about 1.0 to about 2.3 g/ml, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less;

(d) optionally planarizing said silica dielectric film.

The invention further provides a silica dielectric film on a substrate which silica dielectric film has a density of from about 1.0 to about 2.3 g/ml, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less.

DETAILED DESCRIPTION OF THE PREFERRED EMBODIMENT

Silicon-based dielectric films are prepared from a composition comprising a suitable silicon containing pre-polymer, blended with a metal-ion-free catalyst or a nucleophile, and optional water. One or more optional solvents and/or other components may also be included. The dielectric precursor composition is applied to a substrate suitable, e.g., for production of a semiconductor device, such as an integrated circuit ("IC"), by any art-known method to form a film. The composition is then crosslinked to produce a substantially crack-free, and void-free silica dielectric film.

The films produced by the processes of the invention have a number of advantages over those previously known to the art, including substantially crack-free and substantially void free gap-fill, improved density, mechanical strength, that enables the produced film to withstand the further processing steps required to prepare a semiconductor device on the treated substrate, and excellent wet etch resistance which is comparable to PECVD silicon oxide.

It should be understood that the term gelling refers to condensing, or polymerization, of the combined silica-based precursor composition on the substrate after deposition.

Dielectric films are prepared from suitable compositions applied to substrates in the fabrication of integrated circuit devices. Art-known methods for applying the dielectric precursor composition, include, but are not limited to, spin-coating, dip coating, brushing, rolling, and/or spraying. Prior to application of the base materials to form the dielectric film, the substrate surface is optionally prepared for coating by standard, art-known cleaning methods. The coating is then processed to achieve the desired type and consistency of dielectric coating, wherein the processing steps are selected to be appropriate for the selected precursor and the desired final product. Further details of the inventive methods and compositions are provided below.

A "substrate" as used herein includes any suitable composition formed before a silica film of the invention is applied to and/or formed on that composition. For example, a substrate is typically a silicon wafer suitable for producing an integrated circuit, and the base material from which the silica film is formed is applied onto the substrate by conventional methods. Suitable substrates for the present invention non-exclusively include films, glass, ceramic, plastic, composite materials, silicon and compositions containing silicon such as crystalline silicon, polysilicon, amorphous silicon, epitaxial silicon, silicon dioxide ("$SiO_2$"), silicon nitride, silicon oxide, silicon oxycarbide, silicon carbide, silicon oxynitride, organosiloxanes, organosilicon glass, fluorinated silicon glass, and semiconductor materials such as gallium arsenide ("GaAs"), and mixtures thereof. In other embodiments, the substrate comprises a material common in the packaging and circuit board industries such as silicon, glass, and polymers. The circuit board made up of the present composition will have mounted on its surface patterns for various electrical conductor circuits. The circuit board may include various reinforcements, such as woven non-conducting fibers or glass cloth. Such circuit boards may be single sided, as well as double sided.

On the surface of the substrate is an optional pattern of raised lines, such as oxide, nitride or oxynitride lines which are formed by well known lithographic techniques. Suitable materials for the lines include silicon oxide, silicon nitride, and silicon oxynitride. Other optional features of the surface of a suitable substrate include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane oxide ("PETEOS"), plasma enhanced silane oxide ("PE silane") and combinations thereof, as well as one or more previously formed silica dielectric films.

The silica film of the invention can be applied so as to cover and/or lie between such optional electronic surface features, e.g., circuit elements and/or conduction pathways that may have been previously formed features of the substrate. Such optional substrate features can also be applied above the silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a silica film of the invention, during the manufacture of a multilayer and/or multicomponent integrated circuit. In a further option, a substrate bearing a silica film or films according to the invention can be further covered with any art known non-porous insulation layer, e.g., a glass cap layer.

The crosslinkable composition employed for forming silica dielectric films according to the invention includes one or more silicon-containing prepolymers that are readily condensed. It should have at least two reactive groups that can be hydrolyzed. Such reactive groups include, alkoxy (RO), acetoxy (AcO), etc. Without being bound by any theory or hypothesis as to how the methods and compositions of the invention are achieved, it is believed that water hydrolyzes the reactive groups on the silicon monomers to form Si—OH groups (silanols). The latter will undergo condensation reactions with other silanols or with other reactive groups, as illustrated by the following formulas:

Si—OH+HO—Si→Si—O—Si+H$_2$O

Si—OH+RO—Si→Si—O—Si+ROH

Si—OH+AcO—Si→Si—O—Si+AcOH

Si—OAc+AcO—Si →Si—O—Si+Ac$_2$O

R=alkyl or aryl

Ac=acyl (CH$_3$CO)

These condensation reactions lead to formation of silicon containing polymers. In one embodiment of the invention, the prepolymer includes a compound, or any combination of compounds, denoted by Formula I:

R$x$-Si-L$y$ (Formula I)

wherein x is an integer ranging from 0 to about 2 and y is 4-x, an integer ranging from about 2 to about 4), R is independently alkyl, aryl, hydrogen, alkylene, arylene and/or combinations of these, L is independently selected and is an electronegative group, e.g., alkoxy, carboxyl, amino, amido, halide, isocyanato and/or combinations of these.

Particularly useful prepolymers are those provided by Formula I when x ranges from about 0 to about 2, y ranges from about 2 to about 4, R is alkyl or aryl or H, and L is an electronegative group, and wherein the rate of hydrolysis of the Si-L bond is greater than the rate of hydrolysis of the Si—OCH$_2$CH$_3$ bond. Thus, for the following reactions designated as (a) and (b):

Si-L+H$_2$O→Si—OH+HL (a)

Si—OCH$_2$CH$_3$+H$_2$O→Si—OH+HOCH$_2$CH$_3$ (b)

The rate of (a) is greater than rate of (b).

Examples of suitable compounds according to Formula I include, but are not limited to:

| | |
|---|---|
| Si(OCH$_2$CF$_3$)$_4$ | tetrakis(2,2,2-trifluoroethoxy)silane, |
| Si(OCOCF$_3$)$_4$ | tetrakis(trifluoroacetoxy)silane*, |
| Si(OCN)$_4$ | tetraisocyanatosilane, |
| CH$_3$Si(OCH$_2$CF$_3$)$_3$ | tris(2,2,2-trifluoroethoxy)methylsilane, |
| CH$_3$Si(OCOCF$_3$)$_3$ | tris(trifluoroacetoxy)methylsilane*, |
| CH$_3$Si(OCN)$_3$ | methyltriisocyanatosilane, |

[*These generate an acid catalyst upon exposure to water] and or combinations of any of the above.

In another embodiment of the invention, the composition includes a polymer synthesized from compounds denoted by Formula I by way of hydrolysis and condensation reactions, wherein the number average molecular weight ranges from about 150 to about 300,000 amu, or more typically from about 150 to about 10,000 amu.

In a further embodiment of the invention, silicon-containing prepolymers useful according to the invention include organosilanes, including, for example, alkoxysilanes according to Formula II:

Formula II $$R-\underset{\underset{R}{|}}{\overset{\overset{R}{|}}{Si}}-R$$

Optionally, Formula II is an alkoxysilane wherein at least 2 of the R groups are independently C$_1$ to C$_4$ alkoxy groups, and the balance, if any, are independently selected from the group consisting of hydrogen, alkyl, phenyl, halogen, substituted phenyl. For purposes of this invention, the term alkoxy includes any other organic groups which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

In a further option, for instance, the prepolymer can also be an alkylalkoxysilane as described by Formula II, but instead, at least 2 of the R groups are independently C$_1$ to C$_4$ alkylalkoxy groups wherein the alkyl moiety is C$_1$ to C$_4$ alkyl and the alkoxy moiety is C$_1$ to C$_6$ alkoxy, or etheralkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is C$_1$ to C$_4$ alkyl and the alkoxy moiety is C$_1$ to C$_6$ alkoxy. In yet another preferred embodiment for a vapor phase precursor, at least two R groups are ether-alkoxy groups of the formula (C$_1$ to C$_6$ alkoxy)$_n$ wherein n is 2 to 6.

Preferred silicon-containing prepolymers include, for example, any or a combination of alkoxysilanes such as tetraethoxysilane, tetrapropoxysilane, tetraisopropoxysilane, tetra(methoxyethoxy)silane, tetra(methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy)silane, tetrakis(2-ethylthoxy)silane, tetrakis(methoxyethoxy)silane, and tetrakis(methoxypropoxy)silane are particularly useful for the invention.

In a still further embodiment of the invention, the alkoxysilane compounds described above may be replaced, in whole or in part, by compounds with acetoxy and/or halogen-based leaving groups. For example, the prepolymer may be an acetoxy ($CH_3$—CO—O—) such as an acetoxy-silane compound and/or a halogenated compound, e.g., a halogenated silane compound and/or combinations thereof. For the halogenated prepolymers the halogen is, e.g., Cl, Br, I and in certain aspects, will optionally include F. Preferred acetoxy-derived prepolymers include, e.g., tetraacetoxysilane, methyltriacetoxysilane and/or combinations thereof.

In one particular embodiment of the invention, the silicon containing prepolymer includes a monomer or polymer precursor, for example, acetoxysilane, an ethoxysilane, methoxysilane and/or combinations thereof.

In a more particular embodiment of the invention, the silicon containing prepolymer includes a tetraacetoxysilane, a $C_1$ to about $C_6$ alkyl or aryl-triacetoxysilane and combinations thereof. In particular, as exemplified below, the triacetoxysilane is a methyltriacetoxysilane.

In one embodiment of the invention the silicon containing prepolymer is present in the overall composition in an amount of from about 10 weight percent to about 80 weight percent, in another embodiment from about 20 weight percent to about 60 weight percent.

For non-microelectronic applications, the onium or nucleophile catalyst may contain metal ions. Examples include sodium hydroxide, sodium sulfate, potassium hydroxide, lithium hydroxide, and zirconium containing catalysts.

For microelectronic applications, the composition then contains at least one metal-ion-free catalyst which is an onium compound or a nucleophile. The catalyst may be, for example an ammonium compound, an amine, a phosphonium compound or a phosphine compound. Non-exclusive examples of such include tetraorganoammonium compounds and tetraorganophosphonium compounds including tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof. The composition may comprise a non-metallic, nucleophilic additive which accelerates the crosslinking of the composition. These include dimethyl sulfone, dimethyl formamide, hexamethylphosphorous triamide (HMPT), amines and combinations thereof. The catalyst is usually present in the overall composition in an amount of from about 1 ppm by weight to about 1000 ppm, and more usually present in the overall composition in an amount of from about 6 ppm to about 200 ppm.

The overall composition then optionally includes a solvent composition. Reference herein to a "solvent" should be understood to encompass a single solvent, polar or nonpolar and/or a combination of compatible solvents forming a solvent system selected to solubilize the overall composition components. A solvent is optionally included in the composition to lower its viscosity and promote uniform coating onto a substrate by art-standard methods.

In order to facilitate solvent removal, the solvent is one which has a relatively low boiling point relative to the boiling point of the precursor components. For example, solvents that are useful for the processes of the invention have a boiling point ranging from about 50° C. to about 250° C. to allow the solvent to evaporate from the applied film and leave the active portion of the precursor composition in place. In order to meet various safety and environmental requirements, the solvent preferably has a high flash point (generally greater than 40° C.) and relatively low levels of toxicity. A suitable solvent includes, for example, hydrocarbons, as well as solvents having the functional groups C—O—C (ethers), —CO—O (esters), —CO-(ketones), —OH (alcohols), and —CO—N-(amides), and solvents which contain a plurality of these functional groups, and combinations thereof.

Suitable solvents for use in such solutions of the present compositions include any suitable single or mixture of organic, organometallic, or inorganic molecules that are volatized at a desired temperature. Suitable solvents include aprotic solvents, for example, cyclic ketones such as cyclopentanone, cyclohexanone, cycloheptanone, and cyclooctanone; cyclic amides such as N-alkylpyrrolidinone wherein the alkyl has from about 1 to 4 carbon atoms; and N-cyclohexylpyrrolidinone and mixtures thereof. A wide variety of other organic solvents may be used herein insofar as they are able to aid dissolution of the adhesion promoter and at the same time effectively control the viscosity of the resulting solution as a coating solution. Various facilitating measures such as stirring and/or heating may be used to aid in the dissolution. Other suitable solvents include methyethylketone, methylisobutylketone, dibutyl ether, cyclic dimethylpolysiloxanes, butyrolactone, γ-butyrolactone, 2-heptanone, ethyl 3-ethoxypropionate, 1-methyl-2-pyrrolidinone, and propylene glycol methyl ether acetate (PGMEA), and hydrocarbon solvents such as mesitylene, xylenes, benzene, toluene di-n-butyl ether, anisole, acetone, 3-pentanone, 2-heptanone, ethyl acetate, n-propyl acetate, n-butyl acetate, ethyl lactate, ethanol, 2-propanol, dimethyl acetamide, propylene glycol methyl ether acetate, and/or combinations thereof. It is better that the solvent does not react with the silicon containing prepolymer component.

The solvent component may be present in an amount of from about 10% to about 95% by weight of the overall composition. A more usual range is from about 20% to about 75% and most usually from about 20% to about 60%. The greater the percentage of solvent employed, the thinner is the resulting film.

In another embodiment of the invention the composition may comprise water, either liquid water or water vapor. For example, the overall composition may be applied to a substrate and then exposed to an ambient atmosphere that includes water vapor at standard temperatures and standard atmospheric pressure. Optionally, the composition is prepared prior to application to a substrate to include water in a proportion suitable for initiating aging of the precursor composition, without being present in a proportion that results in the precursor composition aging or gelling before it can be applied to a desired substrate. By way of example, when water is mixed into the precursor composition it is present in a proportion wherein the composition comprises water in a molar ratio of water to Si atoms in the silicon containing prepolymer ranging from about 0.1:1 to about 50:1. In another embodiment, it ranges from about 0.1:1 to about 10:1 and in still another embodiment from about 0.5:1 to about 1.5:1.

The overall composition may also comprise additional components such as adhesion promoters, antifoam agents, detergents, flame retardants, pigments, plasticizers, stabilizers, and surfactants. The composition also has utility in non-microelectronic applications such as thermal insulation, encapsulant, matrix materials for polymer and ceramic composites, light weight composites, acoustic insulation, anticorrosive coatings, binders for ceramic powders, and fire retardant coatings. In another embodiment of the invention, the composition further comprises phosphorous and/ or boron doping. Typically, the optional phosphorous and/or boron is present in an amount ranging from 10 parts per million to 10% by weight of the composition.

Those skilled in the art will appreciate that specific conditions for crosslinking from the dielectric films will depend on the selected materials, substrate and desired structure, as is readily determined by routine manipulation of these parameters. Generally, the coated substrate is subjected to a treatment such as heating, UV or e-beam to effect crosslinking of the composition on the substrate to produce a substantially crack-free, and substantially void-free silica dielectric film. The silica dielectric film has a density of from about 1.0 to about 2.3 g/ml, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less.

In one embodiment, this may be done by heating at a temperature of from about 350° C. to about 650° C. until a substantially crack-free, and substantially void-free silica dielectric film is produced. In another embodiment, heating is conducted at a temperature of from about 350° C. to about 425° C. In one embodiment, the heating may be conducted for from about 3 minutes to about 120 minutes. In another embodiment it may be for a time period ranging from about 5 minutes to about 120 minutes and in still another embodiment from about 5 minutes to about 30 minutes.

Alternatively, crosslinking may be conducted by the application of sufficient actinic radiation, such as ultraviolet or electron beam radiation until a substantially crack-free, and substantially void-free silica dielectric film is produced. Such exposure may be conducted by exposure to ultraviolet radiation from a UV light source such as mercury vapor discharge lamps, carbon arc, pulsed xenon, and lasers. The useful ultraviolet exposure is from about 1 millijoules/cm$^2$ to about 300 millijoules/cm$^2$, or more, depending on the selected composition. The amount of exposure can be readily determined by those skilled in the art.

In another embodiment, crosslinking may be conducted by the application of sufficient electron beam radiation until a substantially crack-free, and substantially void-free silica dielectric film is produced. The electron beam irradiating may be conducted with a uniform, large-area, overall electron beam exposure source which simultaneously exposes substantially all of the image areas of the photosensitive composition simultaneously. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Applied Material Corporation under the trade name "ElectronCure™". The principles of operation and performance characteristics of such device are described in U.S. Pat. No. 5,003,178, the disclosure of which is incorporated herein by reference. The electron beam energy is preferably from about 0.5 to about 30 KeV, and more preferably from about 1 to about 12 KeV and most preferably from about 9 to about 9 KeV. The dose of electrons is from about 1 to about 500,000 µC/cm$^2$, preferably from about 50 to about 50,000 µC/cm$^2$ and more preferably from about 50 to about 5,000 µC/cm$^2$. The electron beam current is preferably from about 1 to about 150 mA, and more preferably from about 1 to about 50 mA. The electron beam irradiating is conducted while the substrate is under a vacuum, for example while vacuum conditions are maintained in the range of from about $10^{-5}$ to about $10^2$ torr. Preferably, the electron beam exposing step is conducted with a wide, large beam of electron beam radiation from a uniform large-area electron beam source which simultaneously covers the entire substrate area, i.e. an area of from about 4 inches to about 256 square inches.

The present composition is particularly useful in microelectronic applications as a dielectric substrate material in microchips, multichip modules, laminated circuit boards, or printed wiring boards. The composition may also be used as an etch stop or hardmask.

The composition may be used in electrical devices and more specifically, as an interlayer dielectric in an interconnect associated with a single integrated circuit ("IC") chip. An integrated circuit chip typically has on its surface a plurality of layers of the present composition and multiple layers of metal conductors. It may also include regions of the present composition between discrete metal conductors or regions of conductor in the same layer or level of an integrated circuit.

The method of the invention is suitable for forming isolation structures in a semiconductor substrate, such as shallow trench isolation structures. In so doing, one may begin by etching trenches in a semiconductor substrate, thereby forming substantially unetched areas of said substrate between the trenches. Thereafter the composition of the invention is deposited and fills the trenches and forms a film. Crosslinking of the composition follows to produce a substantially crack-free silica dielectric film. Optionally the silica dielectric film is planarized such as by chemical mechanical polishing under conditions well known in the art. Excellent void free gap-fill performance can be expected down to 0.01 µm and beyond. Gap-fill capability of high aspect ratio structures can be extended beyond 30:1.

The silica dielectric films resulting from the method of the present invention have a density of from about 1.0 g/milliliter to about 2.3 g/milliliter. In another embodiment the density of the resulting silica dielectric films have a density from about 1.2 g/milliliter to about 1.9 g/milliliter, and in still another embodiment from about 1.2 g/milliliter to about 1.8 g/milliliter. The films have a SiC:SiO bond ratio of about 0.015 or more in one embodiment. In another embodiment the ratio is from about 0.02 or more, and in still another embodiment from about 0.02 to about 0.065 as measured by FTIR area integration.

The films have excellent wet etch resistance having a wet etch removal rate of from about 30 angstroms/minute or less In another embodiment the wet etch removal rate is from about 0 angstroms/minute to about 28 angstroms/minute and in still another embodiment from about 1 angstroms/minute to about 25 angstroms/minute when immersed in a diluted HF-water (100:1 volume: volume ratio). Usually such a test is conducted for a period of about 10 minutes. In one embodiment the resulting films have a dielectric constant of about 4.0 or less. In another embodiment the dielectric constant is about 3.5 or less and in still another embodiment from about 2.5 to about 3.4. The films have breakdown voltage of about 2 MV/cm or more in one embodiment. In another embodiment, it is about 3 MV/cm or more, and in still another embodiment from about 4 to about 5 MV/cm.

The following non-limiting examples serve to illustrate the invention.

EXAMPLES

Analytical Test Methods:

Refractive Index (RI): The refractive index measurements were performed together with the thickness measurements using a J. A. Woollam M-88 spectroscopic ellipsometer. A Cauchy model was used to calculate the best fit for Psi and Delta. Unless noted otherwise, the refractive index was reported at a wavelength of 633 nm (details on Ellipsometry can be found in e.g. "Spectroscopic Ellipsometry and Reflectometry" by H. G. Thompkins and William A. McGahan, John Wiley and Sons, Inc., 1999), which is incorporated herein by referencce.

Dielectric Constant (k(Hg)): CV measurements are performed to determine the dielectric constant (k) of single layer thin films on silicon substrate wafers. The measurements are performed using a Hg probe (Model SSM5100), which contacts the wafer in order to form a MOSCAP structure. A capacitance—voltage (CV) scan is measured using a frequency of 100 kHz. For measurements on p-type wafers the starting voltage is negative. The absolute value of the starting voltage used is determined by the film thickness. It is set so that the starting voltage corresponds to an electric field of about 2 MV/cm (+/−20%). The capacitance reading is obtained at the maximum voltage (accumulation region). Typically a 24 points measurement is performed, which measures at 5 locations, each location is repeated four times. Dielectric constant (k) is calculated from the following equation $$k = C*t/(A*\in) \quad (1)$$

Where:
C is Capacitance (pF)
t is film thickness (A).
A is area in $cm^2$
$\in$ is a constant ($8.854E\text{-}2$ pF $cm^{-1}$)

Field Breakdown Voltage: IV measurements are performed to determine the breakdown field ($F_{BD}$, unit MV/cm). The breakdown field is the electric field at a leakage current of 1e-6A. The IV measurements for thin films (SOG films) are done on the SSM5100 (Hg probe) instrument. Each IV measurement is a destructive test; it can not use the same site again for another measurement (CV or IV). Breakdown voltage ($V_{BD}$) is measured using stepped voltage scan on SSM5100 (Hg probe) and, breakdown field ($F_{BD}$) is calculated using the $V_{BD}$ and film thickness (see equation 1). Breakdown current is defined at 1.0E-06A ($V_{BD}$ is determined at this current value). Leakage current is measured at field of 2 MV/cm during breakdown voltage measurement. Standard breakdown measurement is 25-point pattern per wafer. The maximum (last) voltage is set relative to film thickness. Field break down is calculated from the following equation $$F_{BD} = V_{BD}/t \; (F_{BD} \text{ is reported in MV/cm}) \quad (1)$$

Where:
$V_{BD}$ is breakdown voltage at 1.0 E-6A
t is film thickness in cm.

Example 1

This example shows the production of a silicon-containing pre-polymer. A precursor was prepared by combining 1300 g tetraacetoxysilane, 1300 g methyltriacetoxysilane, and 1400 g propylene glycol methyl ethyl acetate (PGMEA) in a 6 liter reactor containing a overhead stirrer and a jacketed water cooler. These ingredients were weighed out within an $N_2$-environment ($N_2$ glove bag). The reactor was also connected to an $N_2$ environment to prevent environmental moisture from entering the solution (standard temperature and pressure).

The reaction mixture was heated to 80° C. before 194.8 g of water was added to the flask at a rate of 16 ml/minute. After the water addition is complete, the reaction mixture was allowed to cool to ambient before 12.73 g of tetramethyl ammonium acetate (TMAA, 1% in acetic acid) was added. The resulting solution mixture was filtered through a 0.2 micron filter to provide the precursor solution for the next step. The solution is then deposited onto a series of 8-inch silicon wafers, each on a spin chuck and spun at 1000 rpm for 15 seconds. The presence of water in the precursor resulted in the film coating being substantially condensed by the time that the wafer was inserted into the first oven. Insertion into the first oven, as discussed below, takes place within the 10 seconds of the completion of spinning. Each coated wafer was then transferred into a sequential series of ovens preset at specific temperatures, for one minute each. In this example, there are three ovens, and the preset oven temperatures were 125° C., 200° C., and 350° C., respectively. Each wafer is cooled after receiving the three-oven stepped heat treatment, and the produced dielectric film was measured using ellipsometry to determine its thickness and refractive index. The baked film is also heated at a higher temperature to crosslinking further and to produce a substantially crack-free dielectric film for further characterizations. Each wafer is weighed to allow for gravimetric analysis to determine its film density. A small piece of the film-coated wafer is also subjected to wet etch rate analysis. The film-coated wafer piece is immersed in a diluted HF-water (100:1 volume: volume ratio) for a period of 10 minutes. The difference in film thickness divided by the wet etch time (10 min) provides the wet etch rate (WER) of a given film in the 100:1 HF-water solution. PECVD TEOS oxide film is also subjected to this wet etch test to provide a reference for the films. In comparison, PECVD silicon oxide has a WER of 72 Å/min when the film is subjected to 100:1 HF-water solution for 5 min. The capacitance of the film was measured under ambient conditions (room temperature and humidity) using Hg probe. Dielectric constant based on ambient capacitance value is called k ambient. (see Table 1)

Example 2

Each film-coated wafer is then further cured at 425° C. for 60 minutes under flowing nitrogen. A non-porous film made from the liquid precursor of this invention will have a density of 1.40±0.09. The film (Entry 1 of Table 1) has a bake thickness of 6289 Å, a bake refractive index of 1.40, a cure thickness of 6205 Å and a cure refractive index of 1.40. The dielectric constant and field breakdown voltage (FBD) is 3.58 and 5.06, respectively. WER of film is calculated to be at 8 Å/min. In comparison, PECVD silicon oxide has a WER of 72 Å/min. Other film properties are listed in Entry 1 of Table 1.

Example 3

Each film-coated wafer is then further cured at 400° C. for 30 minutes under flowing nitrogen. The film has a bake thickness of 6289 Å, a bake refractive index of 1.40, a cure thickness of 6217 Å and a cure refractive index of 1.40. The dielectric constant and field breakdown voltage (FBD) is 3.62 and 5.01 MV/cm, respectively. WER of film is calculated to be at 5 Å/min. Other film properties are list in Entry 2 of Table 1.

Example 4

In this example, UV energy source was used in assisting the cure of the films. After the film-coated wafer was baked at 125° C. and 200° C. for 1 min each, it is then further cured at 400° C. for 5 minutes under the UV radiation. The film has a bake thickness of 7941 Å, a bake refractive index of 1.40, a cure thickness of 7480 Å and a cure refractive index of 1.40. The dielectric constant and field breakdown voltage (FBD) is 3.07 and 5.60 MV/cm, respectively. WER of film is calculated to be at 0 Å/min. Other film properties are list in Entry 3 of Table 1.

Example 5

A precursor was prepared by combining, in a 100 ml round bottom flask (containing a magnetic stirring bar), 50 g methyltriacetoxysilane, and 43 g propylene glycol methyl ethyl acetate (PGMEA). These ingredients were combined within an $N_2$-environment ($N_2$ glove bag). The reaction mixture was stirred for 10 minutes before 3.06 g of water was added to the flask. After the water addition is complete, the reaction mixture was allowed to cool to ambient before 0.25 g of tetraorganoammonium (TMAA, 1% in acetic acid) were added. The reaction mixture was stirred for another 2 hrs before the resulting solution was filtered through a 0.2 micron filter to provide the precursor solution masterbatch for the next step. The solution is then deposited onto a series of 8-inch silicon wafers, each on a spin chuck and spun at 1000 rpm for 15 seconds. The presence of water in the precursor resulted in the film coating being substantially condensed by the time that the wafer was inserted into the first hot-plate. Insertion into the first hot-plate, as discussed below, takes place within the 10 seconds of the completion of spinning. Each coated wafer was then transferred into a sequential series of hot-plates preset at specific temperatures, for one minute each. In this example, there are three hot-plates, and the preset hot-plate temperatures were 125° C., 200° C., and 350° C., respectively. Each wafer is cooled after receiving the three-hot-plate stepped heat treatment, and the produced dielectric film was measured using ellipsometry to determine its thickness and refractive index. Each film-coated wafer is then further cured at 425° C. for 60 minutes under flowing nitrogen. The film has a bake thickness of 5859 Å, a bake refractive index of 1.39, a cure thickness of 5895 Å and a cure refractive index of 1.39. The dielectric constant and field breakdown voltage (FBD) is 2.92 and 5.49 MV/cm, respectively. WER of film is calculated to be at 0 Å/min. Other film properties are list in Entry 3 of Table 1.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method of producing a silica dielectric film comprising
   (a) preparing a composition comprising a silicon containing pre-polymer, a metal-ion-free catalyst, and optionally water;
   (b) coating a substrate with the composition to form a film,
   (c) crosslinking the composition with at least one of i), ii) and iii):
      i) heating the composition at a temperature of from about 350° C. to about 650° C.,
      ii) exposing the composition to sufficient ultraviolet radiation,
      iii) exposing the composition to sufficient electron beam radiation,
   effective to produce a substantially crack-free, and substantially void-free silica dielectric film having a density of from about 1.0 g/milliliter to about 2.3 g/milliliter, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less.

2. The method of claim 1 wherein the composition of step (a) comprises water.

3. The method of claim 1 wherein the composition of step (a) comprises a metal-ion-free catalyst selected from the group consisting of onium compounds and nucleophiles.

4. The method of claim 1 wherein the resulting silica dielectric film has a density of from about 1.2 g/milliliter to about 1.9 g/milliliter.

5. The method of claim 1 wherein step (c) is conducted by heating at a temperature of from about 350° C. to about 650° C.

6. The method of claim 1 wherein step (c) is conducted by heating at a temperature of from about 350° C. to about 425° C.

7. The method of claim 1 wherein step (c) is conducted by heating for from about 30 minutes to about 120 minutes.

8. The method of claim 1 wherein step (c) comprises heating the film at a temperature ranging from about 350° C. to about 425° C., for a time period ranging from about 3 minutes to about 75 minutes.

TABLE 1

| | Cure conditions[a] | Thickness | RI | Film Shrinkage % | SiC/SiO Ratio | (Si)OH/SiO Ratio | K (Hg) | FBD (MV/cm) | Contact Angle | WER |
|---|---|---|---|---|---|---|---|---|---|---|
| 1 | A | 6205 | 1.40 | 1.34 | 0.031 | 0.012 | 3.58 | 5.06 | 86 | 8 |
| 2 | B | 6217 | 1.40 | 1.14 | 0.031 | 0.013 | 3.62 | 5.01 | 85 | 5 |
| 3 | C | 7480 | 1.40 | 5.81[b] | 0.028 | 0 | 3.07 | 5.60 | 92 | 0 |
| 4 | A | 5895 | 1.39 | −0.61 | 0.062 | 0 | 2.92 | 5.49 | 101 | 0 |

[a]Cure Conditions: A: 425° C. for 60 min under $N_2$; B: 400° C. for 30 min under $N_2$; C: baked at 125 and 200° C. for 1 minute each and then cured under a UV lamp at 400° C. for 5 min.;
[b]This particular shrinkage value is calculated based on the film thickness differences from the 200° C. baked and UV-cured film.

9. The method of claim 1 wherein step (c) is conducted with ultraviolet radiation.

10. The method of claim 1 wherein step (c) is conducted with electron beam radiation.

11. The method of claim 1 wherein the catalyst is selected from the group consisting of ammonium compounds, amines, phosphonium compounds and phosphine compounds.

12. The method of claim 1 wherein the catalyst is selected from the group consisting of tetraorganoammonium compounds and tetraorganophosphonium compounds.

13. The method of claim 1 wherein the catalyst is selected from the group consisting of tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof.

14. The method of claim 1 wherein the composition further comprises a non-metallic, nucleophilic additive which accelerates the crosslinking of the composition.

15. The method of claim 1 wherein the composition further comprises a nucleophilic additive which accelerates the crosslinking of the composition, which is selected from the group consisting of dimethyl sulfone, dimethyl formamide, hexamethylphosphorous triamide, amines and combinations thereof.

16. The method of claim 1 wherein the composition comprises water in a molar ratio of water to silicon ranging from about 0.1:1 to about 50:1.

17. The method of claim 1 wherein the composition comprises a silicon containing prepolymer of Formula I:

$$R_x\text{-Si-}L_y \qquad \text{(Formula I)}$$

wherein x is an integer ranging from 0 to about 2, and y is x-4, an integer ranging from about 2 to about 4;

R is independently selected from the group consisting of alkyl, aryl, hydrogen, alkylene, arylene, and combinations thereof;

L is an electronegative moiety, independently selected from the group consisting of alkoxy, carboxyl, acetoxy, amino, amido, halide, isocyanato and combinations thereof.

18. The method of claim 17 wherein the composition comprises a polymer formed by condensing a prepolymer according to Formula I, wherein the number average molecular weight of said polymer ranges from about 150 to about 300,000 amu.

19. The method of claim 1 wherein the composition comprises a silicon containing pre-polymer selected from the group consisting of an acetoxysilane, an ethoxysilane, a methoxysilane, and combinations thereof.

20. The method of claim 1 wherein the composition comprises a silicon containing pre-polymer selected from the group consisting of tetraacetoxysilane, a $C_1$ to about $C_6$ alkyl or aryl-triacetoxysilane, and combinations thereof.

21. The method of claim 20 wherein said triacetoxysilane is methyltriacetoxysilane.

22. The method of claim 1 wherein the composition comprises a silicon containing pre-polymer selected from the group consisting of tetrakis(2,2,2-trifluoroethoxy)silane, tetrakis(trifluoroacetoxy)silane, tetraisocyanatosilane, tris(2,2,2-trifluoroethoxy)methylsilane, tris(trifluoroacetoxy)methylsilane, methyltriisocyanatosilane and combinations thereof.

23. The method of claim 1 wherein the composition further comprises a solvent.

24. The method of claim 1 wherein the composition further comprises a solvent in an amount ranging from about 10 to about 95 percent by weight of the composition.

25. The method of claim 1 wherein the composition further comprises a solvent having a boiling point ranging from about 50 to about 250° C.

26. The method of claim 1 wherein the composition further comprises a solvent selected from the group consisting of hydrocarbons, esters, ethers, ketones, alcohols, amides and combinations thereof.

27. The method of claim 26 wherein the solvent is selected from the group consisting of di-n-butyl ether, anisole, acetone, 3-pentanone, 2-heptanone, ethyl acetate, n-propyl acetate, n-butyl acetate, ethyl lactate, ethanol, 2-propanol, dimethyl acetamide, propylene glycol methyl ether acetate, and combinations thereof.

28. The method of claim 1 wherein the composition further comprises phosphorous and/or boron doping.

29. The method of claim 1 wherein the composition optionally comprises phosphorous and/or boron in an amount ranging from 10 parts per million to 10% by weight of the composition.

30. A method of forming isolation structures in a semiconductor substrate comprising:
   a) etching trenches in a semiconductor substrate, thereby forming substantially unetched areas of said substrate between said trenches;
   b) depositing a composition that substantially fills said trenches and forms a film, said composition comprising a silicon containing pre-polymer, a metal-ion-free, optionally water, and optionally phosphorous and/or boron doping;
   (c) crosslinking the composition with at least one of i), ii) and iii):
      i) heating the composition at a temperature of from about 350° C. to about 650° C.,
      ii) exposing the composition to sufficient ultraviolet radiation,
      iii) exposing the composition to sufficient electron beam radiation,
   effective to produce a substantially crack-free, and substantially void-free silica dielectric film having a density of from about 1.0 g/milliliter to about 2.3 g/milliliter, a SiC:SiO bond ratio of about 0.015 or more, a dielectric constant of about 4.0 or less, a breakdown voltage of about 2 MV/cm or more, and a wet etch resistance in a 100:1 by volume mixture of water and hydrogen fluoride of about 30 Å/minute or less;
   (d) optionally planarizing said silica dielectric film.

31. The method of claim 30 wherein step d) is conducted.

32. The method of claim 30 wherein step d) is conducted by polishing said silica dielectric film by chemical mechanical polishing.

33. The method of claim 30 wherein step (c) is conducted by heating at a temperature of from about 350° C. to about 650° C.

34. The method of claim 30 wherein step (c) is conducted by exposing to sufficient ultraviolet radiation.

35. The method of claim 30 wherein step (c) is conducted by exposing to sufficient electron beam radiation.

* * * * *